United States Patent [19]
Wetters

[11] Patent Number: 5,675,614
[45] Date of Patent: Oct. 7, 1997

[54] DIGITAL SQUELCH CIRCUIT

[75] Inventor: John D. Wetters, Coral Springs, Fla.

[73] Assignee: Motorola, Inc., Schaumburg, Ill.

[21] Appl. No.: 522,891

[22] Filed: Sep. 1, 1995

[51] Int. Cl.$^6$ .................................................. H04B 1/10
[52] U.S. Cl. .................................................. 375/351; 455/212
[58] Field of Search .................................... 375/351, 217, 375/346; 455/212, 218, 222, 221, 223; 340/825.65, 825.77

[56] References Cited

U.S. PATENT DOCUMENTS

| | | | |
|---|---|---|---|
| 3,851,253 | 11/1974 | Eastmond | 455/212 |
| 3,852,671 | 12/1974 | Risley | 455/218 |
| 3,939,431 | 2/1976 | Cohlman | 455/221 |
| 3,940,698 | 2/1976 | Itoh | 455/212 |
| 4,344,175 | 8/1982 | Leslie | 455/218 |
| 4,783,845 | 11/1988 | McChesney et al. | 375/351 |
| 5,408,693 | 4/1995 | Alton et al. | 375/351 |
| 5,446,921 | 8/1995 | Tobler | 375/351 |

*Primary Examiner*—Tesfaldet Bocure
*Attorney, Agent, or Firm*—M. Mansour Ghomeshi

[57] ABSTRACT

A digital squelch system (100) includes a timing signal generator (102) for generating a reference window. An edge detector (106) detects edges in the input signal during this reference window. An accumulator (110) accumulates the number of coherencies. An overflow detector (112) coupled to the accumulator (110) detects overflow conditions therein. A latch coupled to the overflow detector (112) squelches and unsquelches the radio (200) when the overflow or underflow conditions have been detected, respectively.

12 Claims, 2 Drawing Sheets

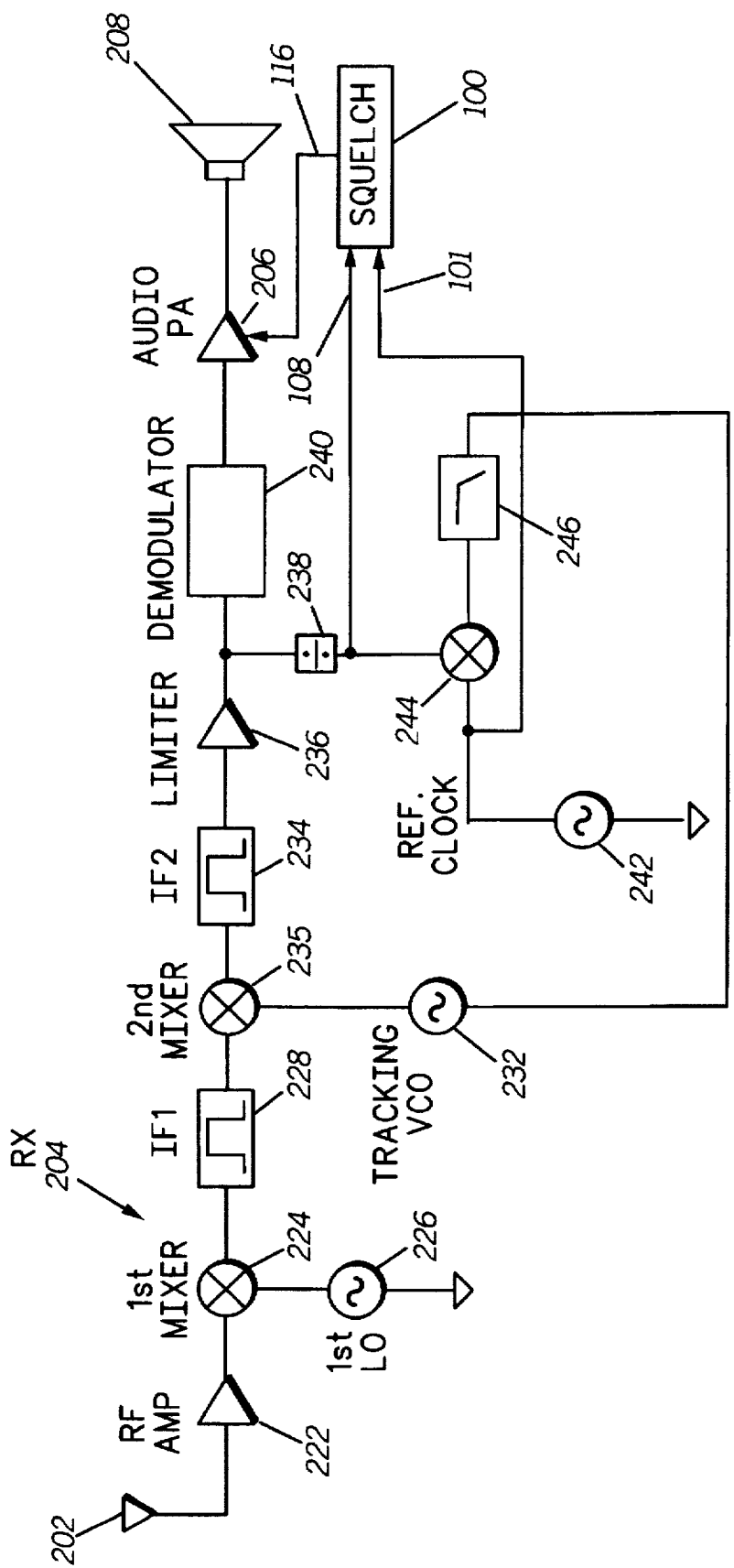

DIGITAL SQUELCH CIRCUIT

TECHNICAL FIELD

This invention relates generally to squelch circuits and more specifically to a digital squelch circuits.

BACKGROUND

Modern radio receivers are typically equipped with a squelch circuit to disable the receiver's audio amplifier in the absence of a desired radio frequency signal. The squelch circuit prevents noise from reaching the speaker when no signal is being received. Basically, a noise squelch circuit detects discriminator output signal to noise variation as the received carrier strength varies. Existing noise squelch circuits are dependent on receiver front end takeover gain, IF (intermediate frequency) bandwidth and the type of discriminator used.

Typically a dedicated squelch circuit includes a noise amplifier stage, a pre-emphasis filter stage, a limiter stage, a high pass filter stage, a noise squelch rectifier stage, a DC amplifier stage and finally a comparator stage for comparing the received signal with the preset squelch level in the radio which is normally set by the radio user. More advanced squelch circuits include additional circuits for the prevention of fading and other phenomena associated with temporary changes in the RF signal strengths. These dedicated squelch circuits are expensive and demand appreciable real estate on the circuit board. Despite the high cost and space requirement, the circuits are indispensable mainly to their significant performance benefits.

As the size and price of communication devices shrink, it is desired that squelch circuits follow the trend. In particular, a need exists for a low cost squelch circuit for use in a direct conversion receiver and one that does not suffer from process variations experienced with present squelch circuits.

BRIEF DESCRIPTION OF THE DRAWINGS

FIG. 2 is a communication device in accordance with the present invention.

DETAILED DESCRIPTION OF THE PREFERRED EMBODIMENT

Figure 1:
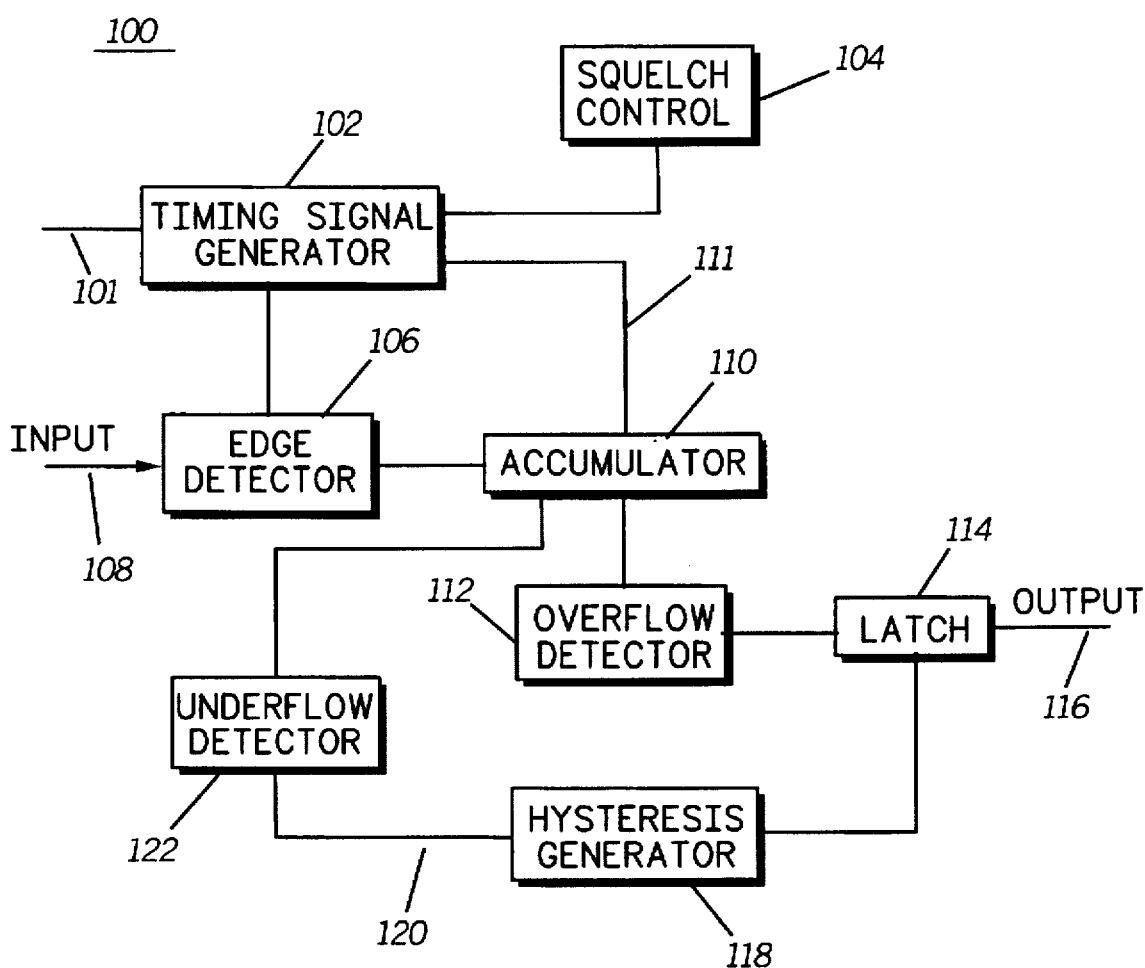
FIG. 1 shows a squelch circuit in accordance with the present invention.

To overcome the complexities of existing squelch circuits, the present invention utilizes an edge detector that detects coherencies between a reference clock signal and a limited IF of a tracking phase locked loop receiver input signal. An accumulator keeps track of these coherencies and establishes squelch based on an overflow condition. In order to better understand the principle behind this operation, reference to drawings and particularly to FIG. 1 is made.

Referring to FIG. 1, components of a squelch circuit 100 in accordance with the present invention are shown. A limited tracking IF input signal 108 from a tracking loop receiver 204 (FIG. 2) is coupled to an edge detector 106. Another input to the edge detector 106 arrives from the timing signal generator 102. This timing signal generator 102 generates a reference window. The control circuit 104 establishes the state of the squelch (i.e. tight or threshold). The detected edges (coherencies) are reported to an accumulator 110 where the number of edges are summed. An overflow detector 112 reports overflow conditions to a latch 114. The latch 114 receives an input from the hysteresis generator 118 which is used to prevent chatter. The output 116 from the latch 114 is coupled back to the radio 204 (FIG. 2) where it forces a squelch condition.

The present invention utilizes the tracking loop of the ZIF (Zero IF) receiver. When locked, the tracking loop has the property that the edges of the reference clock into the tracking loop phase detector and the divided down limiter edges are in phase. This property can be used to determine relative SINAD (signal to noise ratio) of the discriminator and therefore give a squelch signal (turn the receiver audio on and off).

The timing signal generator 102 generates a reference window during which edges are detected via the edge detector 106. The purpose of the timing signal generator 102 is to use the reference signal generated by oscillator 242 (FIG. 2) from the tracking loop of the direct conversion receiver 204 and to generate a timing signal that is ±Pi/2 degrees in phase with the expected positive edge of the divided down loop signal. In the preferred embodiment, the counts of 16, 48, 80 and 112 are detected in a seven stage ripple counter with a total number of counts of 128. The total count of 128 corresponds to 4p radians (two cycles) of the reference signals. Therefore, Pi/2 radians corresponds to 16 counts. The expected leading edge of the divided down loop is at Pi/2 or 32 counts and at 3×Pi/2 or 96 counts. A window of ±Pi/2 is established by generating an enable pulse at counts of 16, 48, 80, and 112. These enable pulses are sent to the edge detector 106 that gates a count to the accumulator 110 if the positive edge of the divided down loop is detected in the enable period. If the input signal 108 is exactly in phase with the reference signal, a positive edge of the reference will be generated on counts 32 and 96 at the edge detector 106. However, because under noise conditions, there will be increasing uncertainty in the timing of the edge of the divided down loop (108) and the reference (101) as the detected signal becomes weaker a small number of positive edges will be detected under lower signal conditions.

The accumulator 110 sums the number of edges in the −π/2 to +π/2 window. If the accumulator 110 overflows, it is known that the signal is strong enough to open the audio and therefore an unsquelch signal is sent to the receiver via the latch 114. The accumulator 110 is periodically reset by a reset 111 from the timing signal generator 102. The longer the reference period the tighter the squelch is set. Therefore, a stronger signal is needed to open the squelch.

The hysteresis generator 118 is utilized to prevent chatter that would occur when the signal strength temporarily diminishes causing a premature squelch condition. The circuit 118 closes the squelch only after multiple underflows of the accumulator 110 have been detected by detector 122. If the accumulator 110 underflows after the reference period reset, the circuit knows that the signal was not strong enough to open the squelch. If several underflows of the accumulator 110 are detected, the squelch will close the audio without a chatter.

In summary, the timing signal generator 102 establishes a window during which edges of an input signal 108 are detected. The accumulator 110 keeps track of the detected edges or coherencies. The control 104 through the signal generator 102 establishes the period of integration during which coherencies (detected edges) are accumulated. This period of integration determines the nature of the squelch control (tight or loose) squelch levels. An overflow condition is detected by the overflow detector 112 and reported to the latch 114. This condition is then carried on to the receiver 204 where the appropriate components thereof are unsquelched for the audio to be heard.

Referring to FIG. 2, a radio communication device 200 in accordance with the present invention is shown. A Radio Frequency (RF) signal received at the antenna 202 is coupled to a RF amplifier 222 before it is coupled to a mixer 224 where it is mixed with a local oscillator signal from LO 226. The converted signal is filtered by a first Intermediate Frequency (IF) filter before it is applied to a second mixer 230. The second input to the mixer 230 is derived from a tracking Voltage Controlled Oscillator 232. The second mixer output signal is filtered at a second IF filter 234 before it is limited at limiter 236. A sample of the limited signal is divided down by divider 238 and applied to a tracking loop mixer 244. The tracking loop includes a reference clock 242 which provides a reference signal to the mixer 244. The mixer output signal is filtered by filter 246 before it is looped back to the VCO 232. A sample 101 of the reference clock 242 is routed to the squelch circuit 100. A sample 108 of the divided down signal from the output of divider 238 is also routed to the squelch circuit 100 for the detection of edges.

The output of the limiter 236 is routed to a demodulator 240 where the received signal is demodulated. An audio amplifier 206 amplifies the demodulated signal before it is applied to a speaker 208. Once the squelch circuit 100 has determined that the radio must be squelched, a signal 116 is routed to the amplifier 206 where the received signal is prevented from reaching the speaker 208. Once a strong signal has been detected, and an unsquelch command generated by the squelch circuit 100, the amplifier 206 is directed to couple the speaker 208 to the receiver 204 hence audio can be heard thereon.

In accordance with the present invention, a sample of the received signal is coupled to the edge detector 106. Similarly, a reference window generated by the signal generator 102 is presented to the edge detector 106. The edges (coherencies) is detected during this reference window are counted in the accumulator 110. Overflow conditions which determine the squelch status are detected by detector 112. A resent signal 111 resets the accumulator. The duration of this reset selectively establishes the state of the squelch (tight or threshold) as determined by the control circuit 104.

A benefit of this squelch circuit over previously available ones is that the circuit 100 uses inband signal detection instead of out of band noise detection. This renders the detector 106 more tolerant of changes in front-end gain, changes in the bandwidth of the IF, and changes in the type of discriminator used.

Another benefit of the circuit 100 is that is solves the problem of modulation being detected as noise. This is solved by having the correlator window set to -Pi/2 to Pi/2 around the expected transition of the positive going edge of the timing reference clock and sampling the limited IF twice as fast as the reference clock signal. This allows a slip in phase from the modulation of the received carrier to still generate a correlation pulse within the correlation window while the jitters from the noise is detected as lack of correlation from the timing reference clock edge.

Yet another benefit of the present invention is that it uses digital circuitry which is robust to process variation. The analog circuitry used in previous squelch designs varied with process variation and required tuning to null out the process variation.

What is claimed is:

1. A digital squelch system, comprising:

a timing signal generator for generating a reference window;

an edge detector for detecting edges of a received signal that occur in the reference window;

an accumulator for accumulating the number of detected edges (coherencies);

means for selecting a period of integration in accumulating coherencies in order to determine tight or lose squelch:

an overflow detector responsive to the accumulator in order to detect an overflow condition in the accumulator; and a latch coupled to the overflow detector to unsquelch the audio.

2. The digital squelch system of claim 1, further including a hysteresis circuit.

3. The digital squelch of claim 1, further including a circuit for setting the squelch state.

4. A method for unsquelching audio in a communication device, comprising:

receiving a sample of a signal:

generating a reference window:

counting occurrence of edges in the sample signal in the reference window:

detecting when the number of edges is alcove a desired limit: unsquelching the communication device in response to the overflow; and selecting the period of integration for summing coherencies in order to determine tight or lose squelch states.

5. The method of claim 4, further including the step of squelching the communication device.

6. The method of claim 4, wherein the step of detecting includes detecting when the number of edges is above a selectively established limit.

7. The method of claim 4, wherein the step of receiving a sample signal includes receiving a Zero IF (Intermediate Frequency) signal.

8. The method of claim 4, further including the step of providing a hysteresis routine.

9. The method of claim 8, wherein the step of providing hysteresis includes the step of squelching the communication device only after a desired number of underflows have been detected.

10. A communication device, comprising:

A digital squelch system, comprising:

a timing signal generator for generating a reference window;

an edge detector for detecting edges of a received signal that occur in the reference window;

an accumulator for accumulating the number of detected edges (coherencies);

means for selecting a period of integration in accumulating coherencies in order to determine tight or lose squelch:

an overflow detector responsive to the accumulator in order to detect an overflow condition in the accumulator; and a latch coupled to the overflow detector to unsquelch the audio.

11. The communication device of claim 10, further including a hysteresis circuit.

12. The communication device of claim 10, further including a circuit for setting the squelch state.

* * * * *